(12) United States Patent
Moon et al.

(10) Patent No.: US 10,439,647 B2
(45) Date of Patent: Oct. 8, 2019

(54) CONTROLLER, SEMICONDUCTOR MEMORY SYSTEM AND OPERATING METHOD THEREOF

(71) Applicants: SK hynix Inc., Gyeonggi-do (KR); Korea Advanced Institute of Science and Technology, Daejeon (KR)

(72) Inventors: Jaekyun Moon, Daejeon (KR); Beongjun Choi, Daejeon (KR); Sung Whan Yoon, Daejeon (KR)

(73) Assignees: SK hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 43 days.

(21) Appl. No.: 15/666,705

(22) Filed: Aug. 2, 2017

(65) Prior Publication Data

US 2018/0062668 A1     Mar. 1, 2018

(30) Foreign Application Priority Data

Aug. 23, 2016  (KR) ........................ 10-2016-0107148

(51) Int. Cl.
| | |
|---|---|
| *H03M 13/09* | (2006.01) |
| *H03M 13/29* | (2006.01) |
| *G06F 11/10* | (2006.01) |
| *G11C 29/52* | (2006.01) |
| *H03M 13/37* | (2006.01) |
| *G11C 29/02* | (2006.01) |
| *G11C 29/50* | (2006.01) |
| *G11C 29/04* | (2006.01) |

(52) U.S. Cl.
CPC ..... *H03M 13/2906* (2013.01); *G06F 11/1012* (2013.01); *G06F 11/1068* (2013.01); *G11C 29/52* (2013.01); *H03M 13/09* (2013.01); *H03M 13/3707* (2013.01); *G11C 29/021* (2013.01); *G11C 29/028* (2013.01); *G11C 29/50004* (2013.01); *G11C 2029/0409* (2013.01)

(58) Field of Classification Search
CPC ..................................................... H03M 13/11
USPC ........................................ 714/758, 761, 760
See application file for complete search history.

(56) References Cited

U.S. PATENT DOCUMENTS

| | | | | |
|---|---|---|---|---|
| 2015/0229337 A1* | 8/2015 | Alhussien | ............. | H03M 13/35 714/773 |
| 2016/0013810 A1* | 1/2016 | Gross | .................... | H03M 13/09 714/776 |
| 2017/0149531 A1* | 5/2017 | Raza | ........................ | G06F 11/10 |
| 2017/0155405 A1* | 6/2017 | Ge | ........................ | H03M 13/13 |
| 2018/0067880 A1* | 3/2018 | Moon | ................. | G06F 12/0246 |

FOREIGN PATENT DOCUMENTS

| | | |
|---|---|---|
| KR | 1020100065192 | 6/2010 |
| KR | 1020140077596 | 6/2014 |
| KR | 1020150093631 | 8/2015 |

\* cited by examiner

*Primary Examiner* — Fritz Alphonse
(74) *Attorney, Agent, or Firm* — IP & T Group LLP

(57) ABSTRACT

An operation method of a controller includes: generating a predetermined number of sub-messages by dividing an original message; generating a first parity added message by adding a cyclic redundancy check (CRC) parity message of a predetermined length to each of the sub-messages; and generating an encoded message by performing a polar encoding operation to the first parity added message.

20 Claims, 13 Drawing Sheets

CONTROLLER, SEMICONDUCTOR MEMORY SYSTEM AND OPERATING METHOD THEREOF

CROSS-REFERENCE TO RELATED APPLICATIONS

The present application claims priority of Korean Patent Application No. 10-2016-0107148, filed on Aug. 23, 2016, which is incorporated herein by reference in its entirety.

BACKGROUND

1. Field

Various exemplary embodiments of the present invention relate to a controller, a semiconductor memory system employing the controller and an operating method thereof.

2. Description of the Related Art

In general, semiconductor memory devices are classified into volatile memory devices, such as Dynamic Random Access Memory (DRAM) and Static RAM (SRAM), and non-volatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

Volatile memory devices lose their stored data when their power supplies are interrupted, whereas non-volatile memory devices retain their stored data even when their power supplies are interrupted. Non-volatile flash memory devices are widely used as storage mediums in computer systems because of their high program speed, low power consumption and large data storage capacity.

In non-volatile memory devices, especially in flash memory devices, the data state of each memory cell depends on the number of bits that the memory cell can program. A memory cell storing 1-bit data per cell is called a single-bit cell or a single-level cell (SLC). A memory cell storing multi-bit data (i.e., 2 or more bits data) per cell is called a multi-bit cell, a multi-level cell (MLC) or a multi-state cell. An MLC is advantageous for high integration. However, as the number of bits programmed in each memory cell increases, reliability of the data stored in the cell decreases and the read failure rate increases.

For example, when k bits are to be programmed in a memory cell, one of $2^k$ threshold voltages is formed in the memory cell. Due to minute differences between the electrical characteristics of memory cells, the threshold voltages of memory cells programmed for the same data form threshold voltage distributions. Threshold voltage distributions correspond to $2^k$ data values corresponding to k-bit information, respectively.

However, a voltage window available for threshold voltage distributions is finite. Therefore, as the value k increases, the distance between the threshold voltage distributions decreases and the neighbouring threshold voltage distributions may overlap. When the neighbouring threshold voltage distributions overlap, read data may include error bits.

FIG. 1 is a graph illustrating threshold voltage distributions for program and erase states of a 3-bit MLC non-volatile memory device.

FIG. 2 is a graph illustrating overlapping threshold voltage distributions for program and erase states due to characteristic deterioration of the 3-bit MLC non-volatile memory device.

In an MLC non-volatile memory device, e.g., an MLC flash memory device capable of storing k-bit data in a single memory cell, the memory cell may have one of $2^k$ threshold voltage distributions. For example, a 3-bit MLC may have a threshold voltage falling within one of 8 threshold voltage distributions.

Threshold voltages of memory cells programmed for the same data form a graph Illustrating threshold voltage distributions due to characteristic differences between memory cells. In the 3-bit MLC non-volatile memory device, as illustrated in FIG. 1, threshold voltage distributions are formed in correspondence with the data states including 7 program states 'P1' to 'P7' and an erase state 'E'. FIG. 1 shows an Ideal case in which threshold voltage distributions do not overlap and have sufficient read voltage margins therebetween.

Referring to the flash memory example of FIG. 2, the memory cell may experience charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 2, the threshold voltage distribution may be shifted left due to charge loss.

Further, program disturbance, erase disturbance and/or back pattern dependency may cause increases in threshold voltages. Such phenomena may increase with higher Integrity memory devices. As characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, a memory cell that has the third program state 'P3' may be erroneously determined to have the second program state 'P2'. In short, when the neighbouring threshold voltage distributions overlap as illustrated in FIG. 2, read data may include a significant number of errors.

It would therefore be desirable to develop new improved devices and methods for more accurately reading data stored in multi-bit memory cells of highly integrated semiconductor memory devices.

SUMMARY

Various embodiments of the present invention are directed to a controller, a semiconductor memory system and an operating method thereof capable of more precisely reading data stored in memory cells of a semiconductor memory device.

In accordance with an embodiment of the present invention, an operation method of a controller may include: dividing an original message into a plurality of sub-messages; generating a first parity added message by adding a cyclic redundancy check (CRC) parity message of a predetermined length to each of the sub-messages; and performing a polar encoding operation to the first parity added message to generate an encoded message.

Preferably, a length of the CRC parity message added to a last one among the sub-messages may be greater than those of remaining ones among the CRC parity messages.

Preferably, each CRC parity message may secure the sub-messages and corresponding CRC messages, which are located there before in the first parity added message.

Preferably, each CRC parity message may secure a corresponding one located right there before among the sub-messages.

In accordance with an embodiment of the present invention, an operation method of a controller may include: performing a polar decoding operation to an encoded message; and generating a decoded message by performing a CRC decoding operation to the polar-decoded message, wherein the encoded message includes: a predetermined number of sub-messages; and a cyclic redundancy check (CRC) parity message of a predetermined length for each of the sub-messages, and wherein the encoded message is further polar-encoded message.

Preferably, the generating of the decoded message may include: generating first candidate messages by applying a successive cancellation list decoding scheme to a plurality of respectively predetermined parts of the encoded message; generating second candidate messages by eliminating polar parity messages of the first candidate messages for the plurality of respectively predetermined parts; and generating the decoded message by eliminating the CRC parity message of the second candidate message, which passes a CRC parity check among the second candidate messages.

Preferably, the encoded message may be divided into the plurality of respectively predetermined parts with reference to a symbol, which corresponds to a last symbol of the CRC parity message, of the encoded message.

Preferably, the first candidate messages may be generated as many as a predetermined number of lists for the plurality of respectively predetermined parts.

Preferably, the decoded message may be generated by further eliminating the second candidate message, which fails the CRC parity check among the second candidate messages, and the first candidate message corresponding to the CRC-failed second candidate message.

Preferably, when there is a plurality of the second candidate messages, which pass the CRC parity check among the second candidate messages, the decoded message may be generated by eliminating the CRC parity message from one having a greatest log likelihood ratio among the plurality of the CRC-passed second candidate messages.

In accordance with an embodiment of the present invention, a controller may include: a polar decoder suitable for performing a polar decoding operation to an encoded message; and a CRC decoder suitable for generating a decoded message by performing a CRC decoding operation to the polar-decoded message, wherein the encoded message includes: a predetermined number of sub-messages; and a cyclic redundancy check (CRC) parity message of a predetermined length for each of the sub-messages, and wherein the encoded message is further polar-encoded message.

Preferably, the polar decoder may generate first candidate messages by applying a successive cancellation list decoding scheme to a plurality of respectively predetermined parts in the encoded message, and generates second candidate messages by eliminating polar parity messages of the first candidate messages for the plurality of respectively predetermined parts.

Preferably, the CRC decoder may generate the decoded message by eliminating the CRC parity message of the second candidate message, which passes a CRC parity check among the second candidate messages.

Preferably, the encoded message may be divided into the plurality of respectively predetermined parts with reference to a symbol, which corresponds to a last symbol of the CRC parity message, of the encoded message.

Preferably, the polar decoder may generate the first candidate messages as many as a predetermined number of lists for the plurality of respectively predetermined parts.

Preferably, the CRC decoder may further eliminate the second candidate message, which falls the CRC parity check among the second candidate messages, and the first candidate message corresponding to the CRC-failed second candidate message.

Preferably, when there is a plurality of the second candidate messages, which pass the CRC parity check among the second candidate messages, the CRC decoder may generate the decoded message by eliminating the CRC parity message from one having a greatest log likelihood ratio among the plurality of the CRC-passed second candidate messages.

Preferably, a length of the CRC parity message added to a last one among the sub-messages may be greater than those of remaining ones among the CRC parity messages and wherein each CRC parity message secures at least a corresponding one located right there before among the sub-messages.

Preferably, the controller may further include: a cyclic redundancy check (CRC) encoder suitable for generating the sub-messages by dividing an original message, and generating a first parity added message by adding the CRC parity message to each of the sub-messages; a polar encoder suitable for generating the encoded message by performing a polar encoding operation to the first parity added message.

Preferably, a length of the CRC parity message added to a last one among the sub-messages may be greater than those of remaining ones among the CRC parity messages.

In accordance with various embodiments of the present invention, data stored in memory cells of a semiconductor memory device may be precisely read.

BRIEF DESCRIPTION OF THE DRAWINGS

These and other features and/or advantages of the present invention will become apparent to those skilled in the art to which this invention belongs in view of the following detailed description in reference to the accompanying drawings in which.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the present invention to those skilled in the art to which the present invention pertains. The scope of the present invention will be understood through the claims of the present invention.

It is noted that the drawings are not necessarily to scale and, in some instances, proportions may have been exaggerated in order to more clearly Illustrate the various elements of the embodiments.

Also, in the following description, numerous specific details are set forth in order to provide a thorough understanding of the present invention. The present Invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 1:
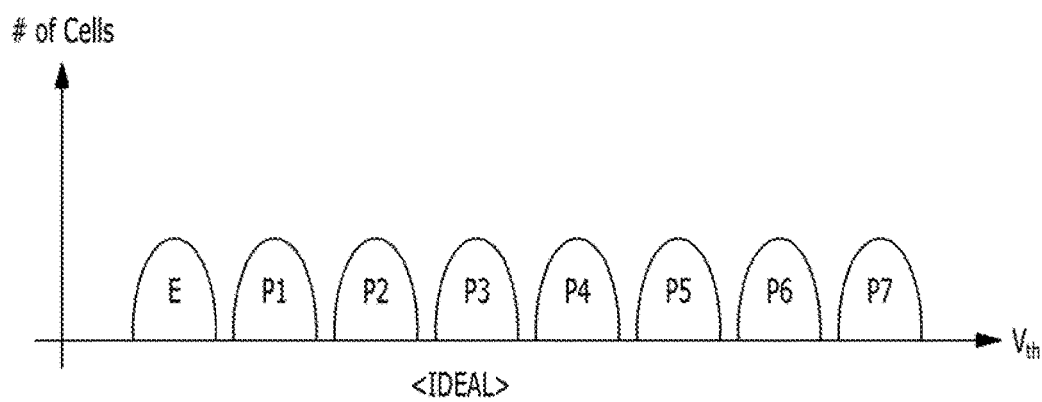
FIG. 1 is a graph illustrating threshold voltage distributions for program and erase states of a 3-bit MLC non-volatile memory device.
Figure 2:
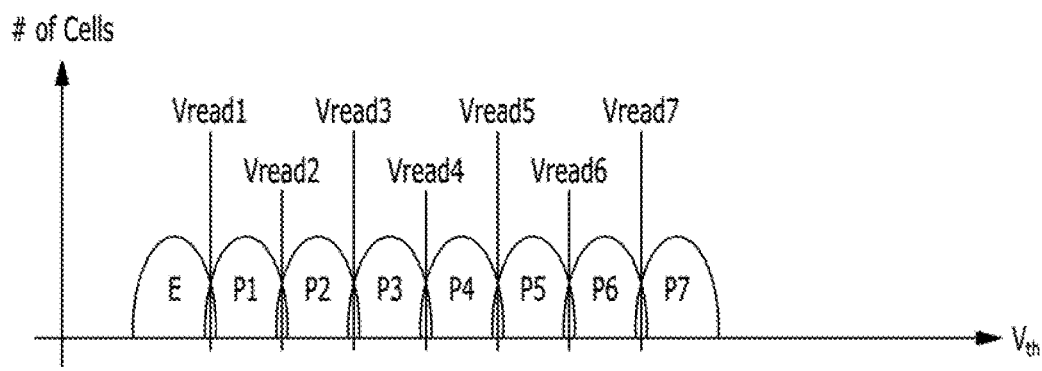
FIG. 2 is a graph illustrating threshold voltage distributions for program and erase states due to characteristic deterioration of a 3-bit MLC non-volatile memory device.
Figure 3:
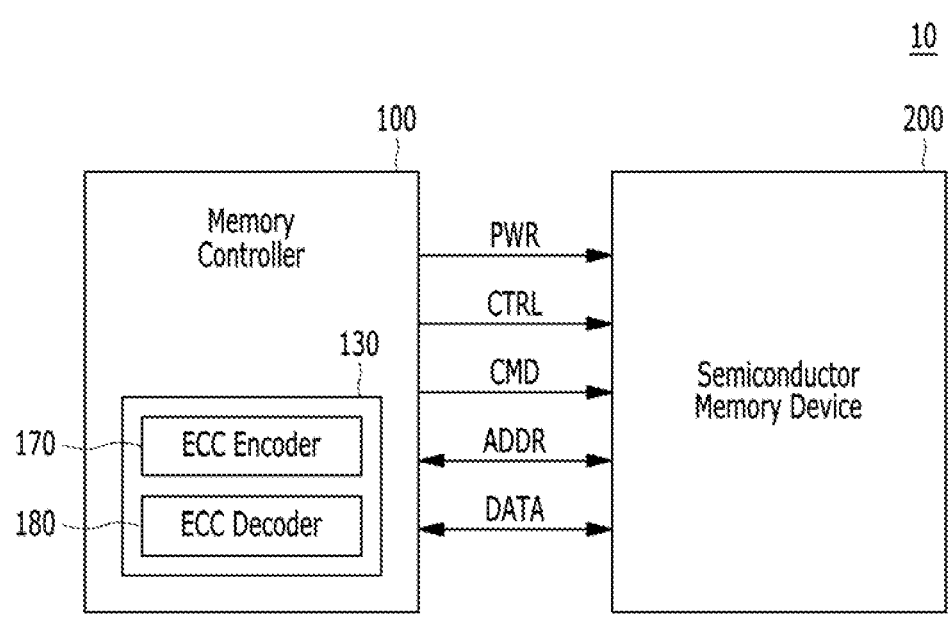
FIG. 3 is a block diagram schematically illustrating a semiconductor memory system in accordance with an embodiment of the present invention.
Figure 4A:
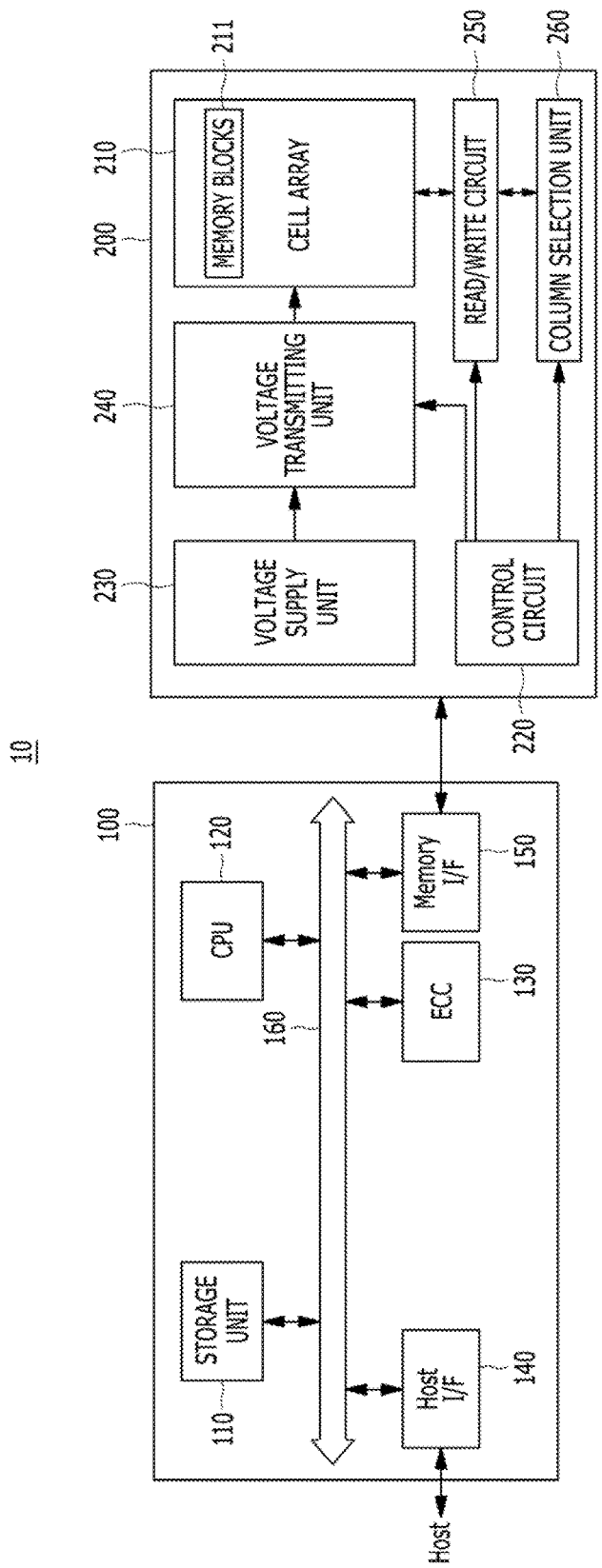
FIG. 4A is a detailed block diagram illustrating the semiconductor memory system of FIG. 3.
Figure 4B:
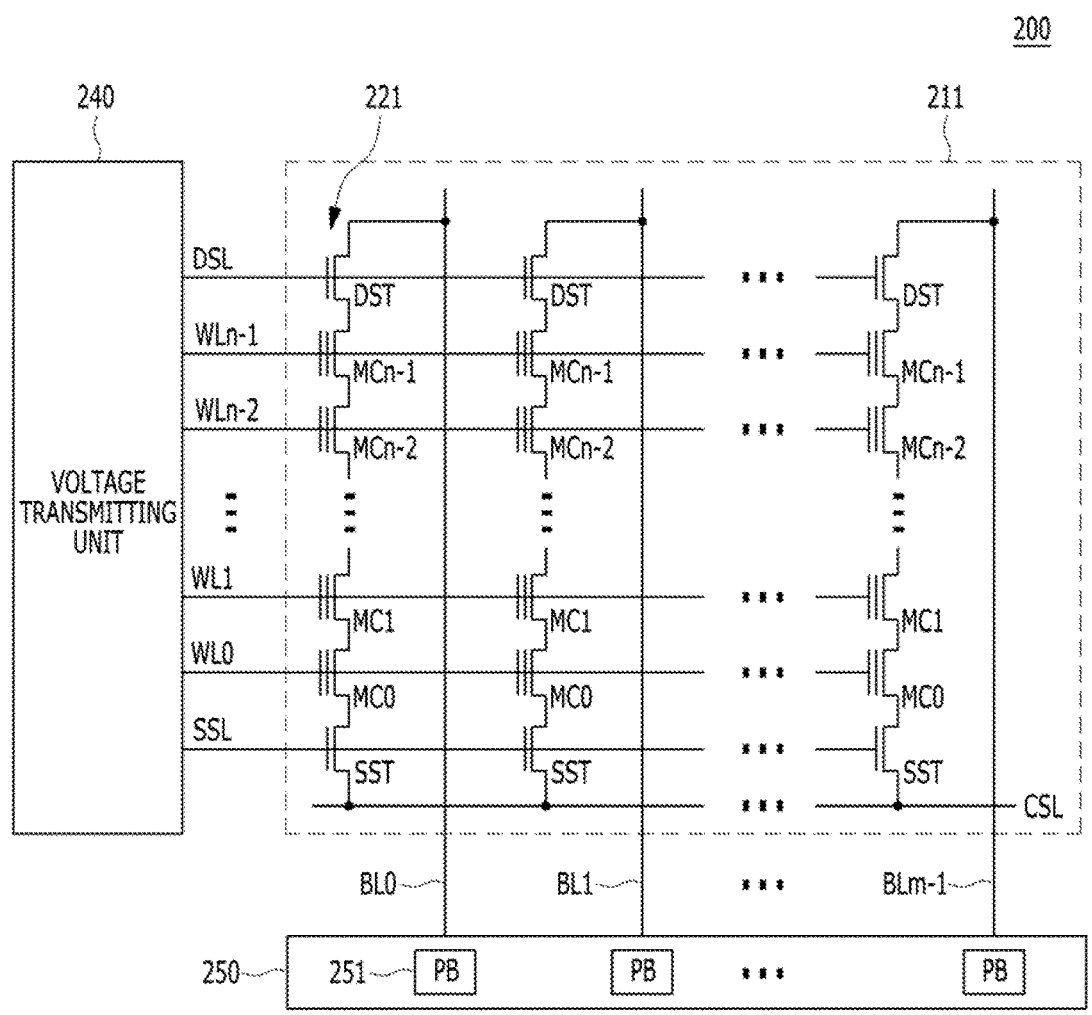
FIG. 4B is a circuit diagram illustrating an exemplary configuration of a memory block employed in the semiconductor memory system of FIG. 4A.
Figure 5:
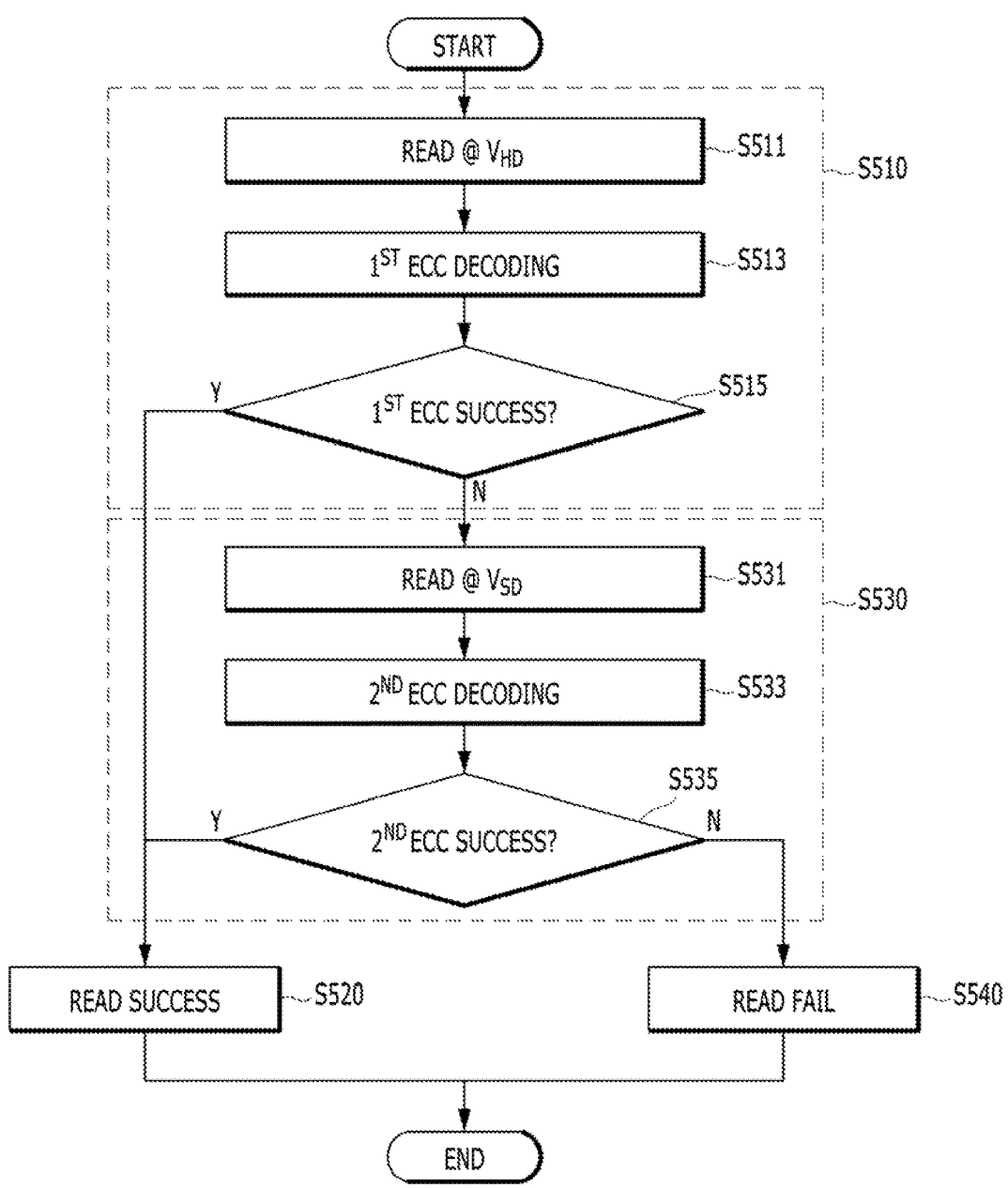
FIG. 5 is a flowchart illustrating an operation of a memory controller employed in the semiconductor memory system shown in FIG. 4A, according to an embodiment of the present invention.

FIG. 3 is a block diagram schematically illustrating a semiconductor memory system 10 in accordance with an embodiment of the present invention. FIG. 4A is a detailed block diagram illustrating an exemplary configuration of the semiconductor memory system 10 of FIG. 3. FIG. 4B is a circuit diagram illustrating an exemplary configuration of a memory block employed in the semiconductor memory system 10 of FIG. 4A. FIG. 5 is a flowchart illustrating an operation of a memory controller 100 employed in the semiconductor memory system shown in FIG. 4A.

Referring now to FIGS. 3 to 5, the semiconductor memory system 10 may Include the semiconductor memory device 200 operatively coupled to the memory controller 100.

The semiconductor memory device 200 may perform one or more of an erase, a program, and a read operation under the control of the memory controller 100. The semiconductor memory device 200 may receive a command CMD, an address ADDR and data DATA through a plurality of input/output lines from the memory controller 100. The semiconductor memory device 200 may receive power PWR through a power line and a control signal CTRL through a control line from the memory controller 100. The control signal may include a command latch enable (CLE) signal, an address latch enable (ALE) signal, a chip enable (CE) signal, a write enable (WE) signal, a read enable (RE) signal, and so on.

The memory controller 100 may control overall operations of the semiconductor memory device 200. The memory controller 100 may include an ECC unit 130 for correcting error bits. The ECC unit 130 may include an ECC encoder 170 and an ECC decoder 180.

The ECC encoder 170 may perform error correction encoding on data to be programmed into the semiconductor memory device 200 to output data to which parity bits are added. The encoded data with the parity bits may be stored in the semiconductor memory device 200.

The ECC decoder 180 may perform error correction decoding on data read from the semiconductor memory device 200. The ECC decoder 180 may determine whether the error correction decoding is successful, and may output an instruction signal based on the determination result. The ECC decoder 180 may correct error bits of data using the parity bits generated by the ECC encoding operation.

When the number of error bits exceeds the error correction capacity of the ECC unit 130, the ECC unit 130 may not correct the error bits. In this case, the ECC unit 130 may generate an error correction fail signal.

The ECC unit 130 may perform an error bit correcting operation using hard decision read data and/or soft decision read data. In an embodiment, the ECC unit 130 may perform an error bit correcting operation using soft decision read data.

The memory controller 100 and the semiconductor memory device 200 may be Integrated in a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is used in an SSD, operation speed of a host (not shown) coupled to the semiconductor memory system 10 may be significantly improved.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semiconductor memory system 10 may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or of a computing system.

Referring to FIG. 4A, in an embodiment, the memory controller 100 may include, in addition to the ECC unit 130, a storage unit 110, a CPU 120, a host interface 140, a memory interface 150 and a system bus 160.

The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk Interface (ESDI), and an integrated drive electronics (IDE).

The ECC unit 130 may detect and correct errors included in the data read from the semiconductor memory device 200. The CPU 120 may perform various control operations. The memory interface 150 may interface with the semiconductor memory device 200.

The ECC encoder 170 and the ECC decoder 180 may be implemented as different and independent components even though FIG. 4A exemplarily shows the ECC unit 130 including both of the ECC encoder 170 and the ECC decoder 180. In accordance with an exemplary embodiment of the present invention, during a program operation, the ECC unit 130 may perform an ECC encoding operation to an original data which is to be programmed to the semiconductor memory device 200. In such case, during the read operation, the ECC unit 130 may perform an ECC decoding operation to the ECC-encoded data or a codeword, which is stored in the semiconductor memory device 200.

An original data is data as received from the host before being encoded ECC by the encoding operation of the ECC unit 130 during a program operation. The ECC-encoded data are stored in the semiconductor memory device 200. The ECC unit 130 may then restore the original data by performing an ECC decoding operation to the ECC-encoded data or the codeword stored in the semiconductor memory device 200.

As discussed with reference to FIG. 5, the read operation to the data stored in the semiconductor memory device 200 may include a hard decision read operation of step S511 and a soft hard decision read operation of step S531. During the hard decision read operation, data may be read from the semiconductor memory device 200 according to a hard decision read voltage $V_{HD}$. During the soft decision read operation, data may be read from the semiconductor memory device 200 according to soft decision read voltages $V_{SD}$, which have different levels than the hard decision read voltage $V_{HD}$. For example, an additional read operation according to the soft decision read voltages $V_{SD}$ may be performed to the memory cell, which is read according to the hard decision read voltage $V_{HD}$.

The ECC-encoded data or the codeword, which is stored in the semiconductor memory device 200 and is read through the hard decision read operation, may be decoded back to the original data by the ECC unit 130.

The soft decision read operation includes generating a log likelihood ratio (LLR), which provides the reliability of the hard decision read data read through the hard decision read operation, according to the soft decision read voltages $V_{SD}$ rather than being just the read operation to data stored in the semiconductor memory device 200.

The ECC unit 130 may perform the ECC decoding operation to the LLR. The ECC unit 130 may detect and correct the error of the ECC-encoded data or the codeword read from the semiconductor memory device 200 through the LLR scheme.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211. The user data may be encoded as described above.

Referring to FIG. 4B, an exemplary configuration of the memory block 211 may include a plurality of cell strings 221 coupled to bit lines BL0 to BLm−1, respectively. The cell string 221 of each column may include one or more drain selection transistors DST and one or more source selection transistors SST. A plurality of memory cells or memory cell transistors may be serially coupled between the selection transistors DST and SST. Each of the memory cells MC0 to MCn−1 may be preferably formed of a multi-level cell (MLC) storing data Information of multiple bits in each cell. The cell strings 221 may be electrically coupled to the corresponding bit lines BL0 to BLm−1, respectively.

FIG. 4B exemplarily illustrates a memory block 211 comprising a plurality of NAND-type flash memory cells. However, the memory block 211 of the semiconductor memory device 200 is not limited to being NAND flash memory. For example, the memory block 211 may comprise a NOR-type flash memory, a hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations including operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply unit 230 may generate a plurality of variable read voltages for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide a word line voltage generated from the voltage supply circuit 230 to a selected word line and may provide a different level voltage to a non-selected word line under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During a normal read operation, the column selection unit 260 may output the data read from the read/write circuit 250 to the outside, for example, to the memory controller 100, based on column address information. On the other hand, during a verification read operation, the read data may be provided to a pass/fail verification circuit (not illustrated) included in the semiconductor memory device 200, and may be used for determining whether a program operation of the memory cell succeeds.

During a program operation, the read/write circuit 250 may operate as a write driver for driving the bit lines according to data to be stored in the memory cell array 210. During a program operation, the read/write circuit 250 may receive data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A and 5, the operation of the memory controller 100 may include a hard decision decoding step S510, and may additionally include a soft decision decoding step S530. A target data of the hard and soft decision decoding steps S510 and S5530, or the data stored in the semiconductor memory device 200 may be the ECC-encoded data or the codeword, which is ECC-encoded by the ECC unit 130.

For example, the hard decision decoding step S510 may be a step of a hard decision ECC decoding operation to hard decision read data of predetermined length, which is read from a memory cell of the memory block 211 according to the hard decision read voltage $V_{HD}$. The hard decision decoding step S510 may include steps S511 to S515.

For example, the soft decision decoding step S530 may be a step of a soft decision ECC decoding operation to the hard decision read data by forming soft decision read data according to soft decision read voltages $V_{SD}$ around the hard decision read voltage $V_{HD}$ when the hard decision ECC decoding operation of the hard decision decoding step S510 finally fails. The soft decision decoding step S530 may include steps S531 to S535.

As described above, at step S511 of the hard decision read step, the hard decision read data may be read from the semiconductor memory device 200 according to the hard decision read voltage $V_{HD}$. The memory controller 100 may provide a read command and an address to the semiconductor memory device 200. The semiconductor memory device 200 may read the hard decision read data therefrom according to the hard decision read voltage $V_{HD}$ in response to the read command and the address. The hard decision read data may be provided to the memory controller 100.

At step S513, a first error correction decoding operation is performed which may be a hard decision ECC decoding operation. The ECC unit 130 may perform the hard decision ECC decoding operation to the hard decision read data, which is read from the semiconductor memory device 200 according to the hard decision read voltage $V_{HD}$ by using the error correction code.

At step S515, it may be determined whether the first error correction decoding operation, i.e., the hard decision ECC decoding operation is a success or a fail. That is, at step S515, it may be determined whether an error of the hard decision read data, to which the hard decision ECC decoding operation is performed at step S513, is corrected. For example, the memory controller 100 may determine whether an error of the hard decision read data is corrected by using the hard decision read data and a parity check matrix. For example, when product result of the parity check matrix and the hard decision read data is a zero vector ('0'), it may be determined that the hard decision read data is corrected. On the other hand, when the product result of the parity check matrix and the hard decision read data is not the zero vector ('0'), it may be determined that the hard decision read data is not corrected.

When it is determined that the hard decision read data is corrected as the result of the determination of step S515, it may be determined at step S520 that the read operation according to hard decision read voltage $V_{HD}$ at step S511 is successful and the operation of the memory controller 100 may end. The hard decision read data, to which the hard decision ECC decoding operation is performed at step S513, may be now the error-corrected data and may be provided externally or used in the memory controller 100.

When it is determined that the hard decision read data is not corrected as the result of the determination of step S515, a second error correction decoding operation may be performed in step S530 which may be a soft decision decoding operation.

As described above, at step S531 of the soft decision read step, the soft decision read data may be read from the semiconductor memory device 200 according to the soft decision read voltages $V_{SD}$. For example, the additional read operation according to the soft decision read voltages $V_{SD}$ may be performed to the memory cell, to which the hard decision decoding step S510 is performed according to the hard decision read voltage $V_{HD}$. The soft decision read voltages $V_{SD}$ may be different from the hard decision read voltage $V_{HD}$.

At step S533, the soft decision ECC decoding operation as the second error correction decoding operation may be performed. The soft decision ECC decoding operation may be performed based on the soft decision read data comprising the hard decision read data, to which the hard decision ECC decoding operation is performed, and data read from the memory cell according to the soft decision read voltages $V_{SD}$. The hard decision read voltage $V_{HD}$ and the soft decision read voltages $V_{SD}$ may be different.

For example, each of the memory cells MC0 to MCn−1 of the semiconductor memory device 200 may belong to one of the threshold voltage distributions including 7 program states P1 to P7 and 1 erase state E.

The hard decision read voltage $V_{HD}$ may have a level between 2 neighbouring states of the plurality of states E and P1 to P7. Each of the soft decision read voltages $V_{SD}$ may have a level, which is different from the hard decision read voltage $V_{HD}$, between 2 neighbouring states of the plurality of states E and P1 to P7.

The hard decision read data read from the memory cells MC0 to MCn−1 according to the hard decision read voltage $V_{HD}$ and the soft decision read data read therefrom according to the soft decision read voltages $V_{SD}$ may have different values. For example, there may be a tailed memory cell among the memory cells MC0 to MCn−1 having a threshold voltage that is higher or lower than the threshold voltage distribution of the normal logic state. The hard decision read data read from the tailed memory cell according to the hard decision read voltage $V_{HD}$ and the soft decision read data read therefrom according to the soft decision read voltages $V_{SD}$ may have different values. When the additional read operation according to the soft decision read voltages $V_{SD}$ is performed as well as the read operation according to the hard decision read voltage $V_{HD}$, additional information on the threshold voltages of the memory cells MC0 to MCn−1 (i.e., additional information on the tailed memory cells) or the log likelihood ratio (LLR) providing reliability of the hard decision read data read by the hard decision read operation may be obtained.

When the additional information is obtained, the probability of the likelihood ratio whether the data of the memory cells MC0 to MCn−1 belong to the first state (i.e., '1'), or the second state (i.e., '0'), may increase. That is, the reliability of the ECC decoding operation may increase. The memory controller 100 may perform the soft decision ECC decoding operation based on the soft decision read data, which is read according to the hard decision read voltage $V_{HD}$ and the soft decision read voltages $V_{SD}$. The relationship between the hard decision read voltage $V_{HD}$ and the soft decision read voltages $V_{SD}$ will be disclosed with reference to FIGS. 7A and 7B.

At step S535, it may be determined whether the second error decoding operation, i.e., the soft decision ECC decoding operation succeeds or fails. That is, at step S535, it may be determined whether an error of the soft decision read data, to which the soft decision ECC decoding operation is performed at step S533, is corrected. For example, the memory controller 100 may determine whether an error of the soft decision read data is corrected by using the soft decision read data and the parity check matrix. For example, when the result of the parity check matrix and the soft decision read data is a zero vector ('0'), it may be determined that the soft decision read data, to which the soft decision ECC decoding operation is performed, is corrected. On the other hand, when the result of the parity check matrix and the soft decision read data is not a zero vector ('0'), it may be determined that the soft decision read data, to which the soft decision ECC decoding operation is performed, is not corrected.

The product process of the parity check matrix and the hard decision read data during the hard decision decoding step S510 may be the same as the product process of the parity check matrix and the soft decision read data during the soft decision decoding step S530. The product process may be the matrix product.

When it is determined that the soft decision read data is corrected as the result of determination of step S535, it may be determined at step S520 that the read operation according to soft decision read voltage $V_{SD}$ at step S531 is successful and the operation of the memory controller 100 may end. The soft decision read data, to which the soft decision ECC decoding operation is performed at step S533, may be now the error-corrected data and may be provided externally or used in the memory controller 100.

When it is determined that the soft decision read data is not corrected as the result of determination of step S535, it may be determined at step S540 that the read operation of the memory controller 100 to the memory cells MC0 to MCn−1 finally fails and the operation of the memory controller 100 may end.

Figure 6:
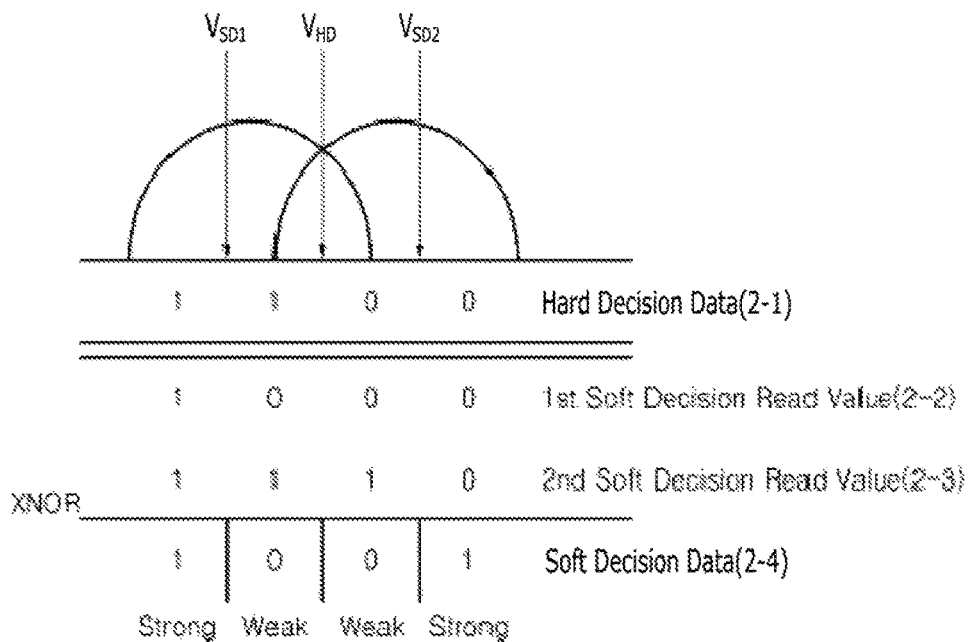
FIG. 6 is a schematic diagram illustrating an exemplary 2-bit soft decision read operation.
Figure 7:
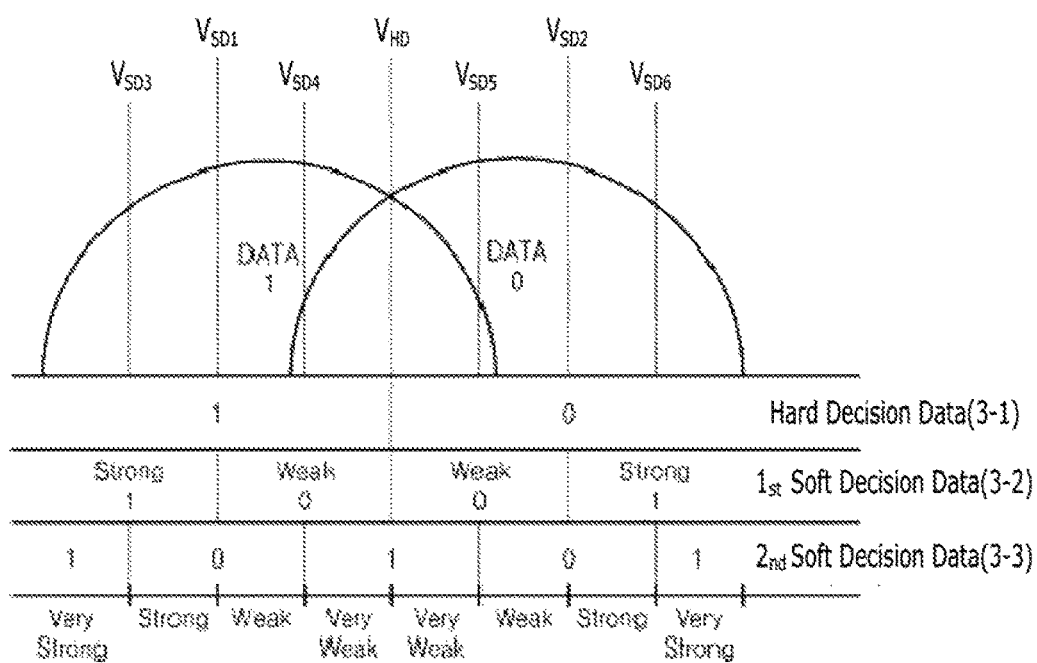
FIG. 7 is a schematic diagram illustrating an exemplary 3-bit soft decision read operation.

FIGS. 6 and 7 are schematic diagrams illustrating exemplary 2-bit and 3-bit soft decision read operations, respectively, according to the method of FIG. 5.

Referring to FIG. 6, during the hard decision decoding operation of step S510 described with reference to FIG. 5, the hard decision read data 2-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ and $V_{SD2}$, which have different levels from the hard decision read voltage $V_{HD}$, are applied to the memory cell.

Referring to FIG. 6, during the 2-bit soft decision read operation, a first soft decision read value 2-2 may be '1000' according to the on/off status of a memory cell when the first soft decision read voltage $V_{SD1}$ is applied to the memory cell. In a similar way, a second soft decision read value 2-3 may be '1110' according to the on/off status of the memory cell when the second soft decision read voltages $V_{SD2}$ is applied to the memory cell.

For example, the ECC unit 130 may generate a soft decision read data 2-4 or the LLR through the XNOR operation to the first and second soft decision read values 2-2 and 2-3. The LLR 2-4 may show reliability of the hard decision read data 2-1.

For example, the value '1' of the soft decision read data 2-4 may show a "strong" probability of the first and second statuses (the logic values of '1' and '0') of the hard decision read data 2-1. On the other hand, the value '0' of the soft decision read data 2-4 may show a "weak" probability of the first and second statuses of the hard decision read data 2-1.

Referring to FIG. 7, during the hard decision decoding operation of step S510 described with reference to FIG. 5, the hard decision read data 3-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ to $V_{SD6}$, which have different levels from the hard decision read voltage $V_{HD}$, are applied to the memory cell.

Referring to FIG. 7, during the 3-bit soft decision read operation, first and second soft decision read values may be generated according to the on/off status of a memory cell when first and second soft decision read voltages $V_{SD1}$ and $V_{SD2}$ are applied to the memory cell, which is similar to the 2-bit soft decision read operation described with reference to FIG. 6. The ECC unit 130 may generate a first soft decision read data 3-2 '1001' or the LLR through an XNOR operation to the first and second soft decision read values.

In a similar way, during the 3-bit soft decision read operation, third to sixth soft decision read values may be generated according to the on/off status of the memory cell when third to sixth soft decision read voltages $V_{SD3}$ to $V_{SD6}$, which have different levels from the first and second soft decision read voltages $V_{SD1}$ and $V_{SD2}$ are applied to the memory cell, which is similar to the 2-bit soft decision read operation described with reference to FIG. 6. The ECC unit 130 may generate a second soft decision read data 3-3 ('10101') or the LLR through the XNOR operation to the third to sixth soft decision read values. The LLR 3-3 ('10101') may provide a weighted value to the first soft decision read data 3-2.

For example, the value '1' of the second soft decision read data 3-3 may show a "very strong" probability of the first status (the logic value of '1') of the first soft decision read data 3-2. On the other hand, the value '0' of the second soft decision read data 3-3 may show a "strong" probability of the first status of the first soft decision read data 3-2.

In a similar way, the value '1' of the second soft decision read data 3-3 may show a "very weak" probability of the second status (the logic value of '0') of the first soft decision read data 3-2. On the other hand, the value '0' of the second soft decision read data 3-3 may show a "weak" probability of the second status of the first soft decision read data 3-2. The LLR 3-3 may provide a better reliability to the hard decision read data 3-1, which is similar to the 2-bit soft decision read operation described with reference to FIG. 6.

Figure 8A:
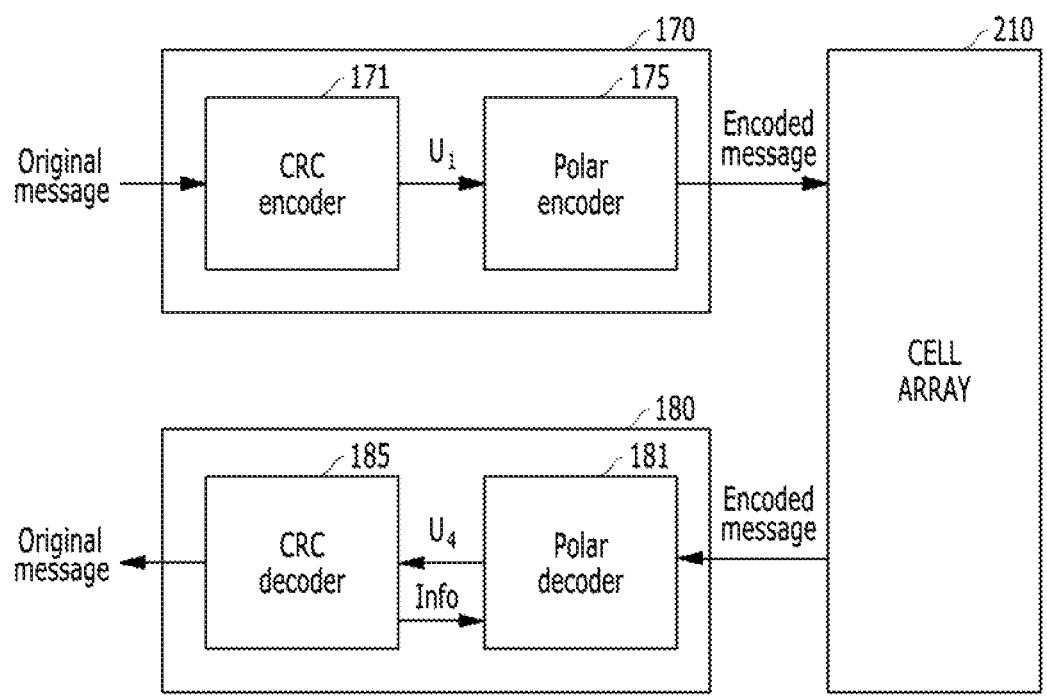
FIG. 8A is a detailed block diagram illustrating an exemplary configuration of an ECC encoder and an ECC decoder employed in the semiconductor memory system of FIG. 3.

FIG. 8A is a detailed block diagram of the ECC encoder 170 and the ECC decoder 180 of FIG. 3 in accordance with an embodiment of the present invention.

Figure 8B:
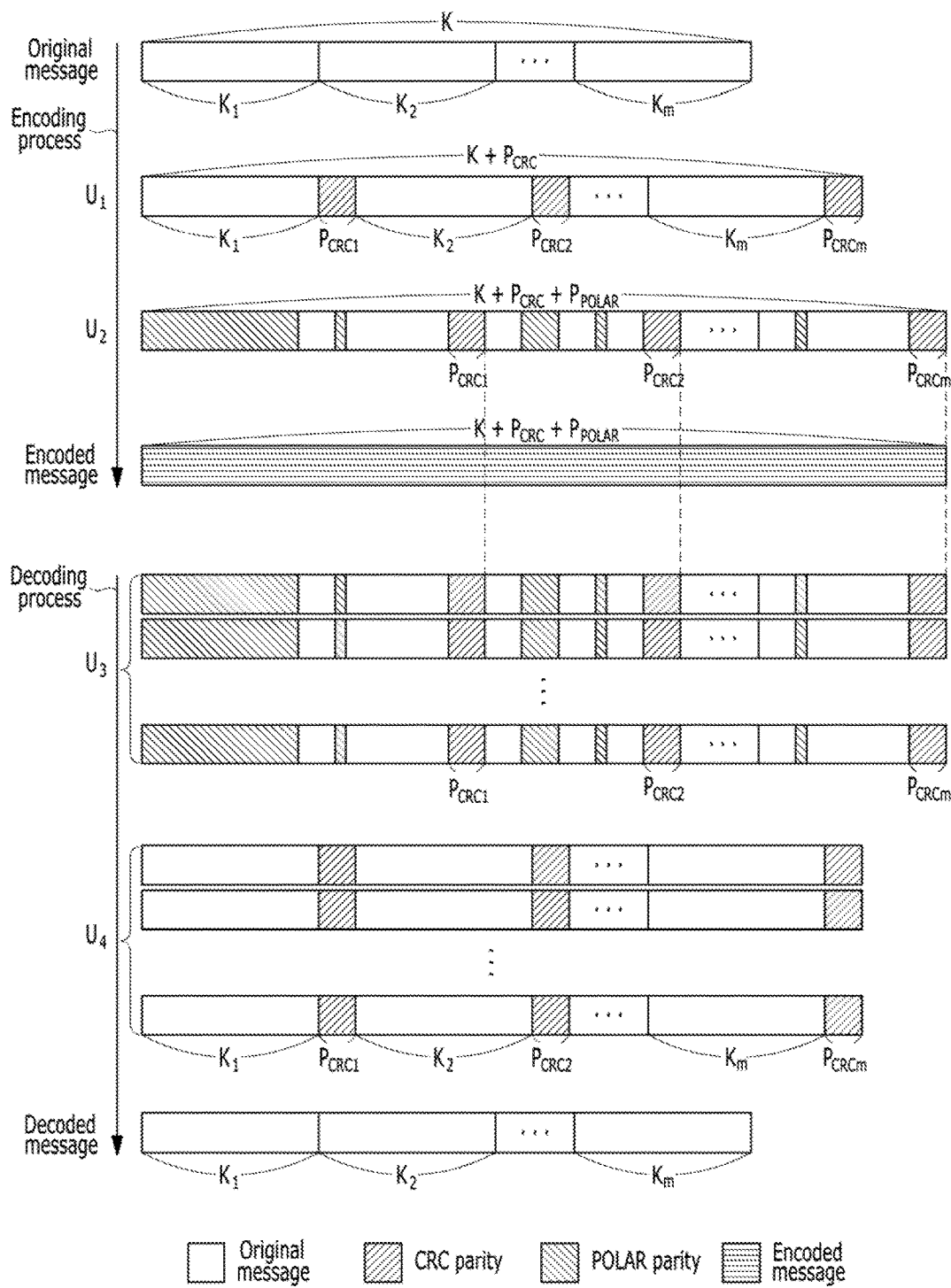
FIG. 8B is a schematic diagram illustrating exemplary encoding and decoding processes.

FIG. 8B a schematic diagram illustrating processes of encoding an original message and decoding an encoded message.

Referring to FIG. 8A, the ECC encoder 170 may include a cyclic redundancy check (CRC) encoder 171 and a polar encoder 175, and the ECC decoder 180 may include a polar decoder 181 and a CRC decoder 185.

The ECC encoder 170 may encode an original message, which is provided through the host interface 140, into an encoded message. The ECC decoder 180 may decode the encoded message, which is read from the semiconductor memory device 210, into a decoded message. The decoded message may correspond to the original message.

Hereinafter, described with reference to FIGS. 8A and 8B will be an encoding operation of encoding an original message into an encoded message.

Referring to FIG. 8A, the CRC encoder 171 may divide the original message into a predetermined number of sub-messages, may perform the CRC encoding operation to the original message by adding a CRC parity message of a predetermined length to each of the sub-messages, and thus may generate a first parity added message $u_1$. The number of sub-messages may be more than two. In an embodiment, each of the CRC parity messages may secure all sub-messages located before a corresponding CRC parity message. In an embodiment, each of the CRC parity messages may secure a single sub-message located right before a corresponding CRC parity message.

A length of the original message may be represented by the sum of the lengths of all sub-messages as defined in the following equation 1.

$$k=k_1+k_2+\ldots+k_m \quad \text{[Equation 1]}$$

In equation 1, "k" may represent a length of the original message, "$k_1$" may represent a length of a first sub-message, "$k_2$" may represent a length of a second sub-message and "$k_m$" may represent a length of a last sub-message.

The first sub-message may be located in a first section of the original message and the last sub-message may be located in a last section of the original message. That is, (i)th sub-message may be located in a (i)th section of the original message. The "i" may be an integer between one (1) to "m", which is a number of the sub-messages.

A total length of all CRC parity messages added to all of the sub-messages in the original message may be represented by the sum of the lengths of the all CRC parity messages as defined in the following equation 2.

$$p_{crc}=p_{crc1}+p_{crc2}+\ldots+p_{crcm} \quad \text{[Equation 2]}$$

In equation 2, "$p_{crc}$" may represent the total length of all CRC parity messages, "$p_{crc1}$" may represent a length of a first CRC parity message located right after the first sub-message, "$p_{crc2}$" may represent a length of a second CRC parity message located right after the second sub-message and "$p_{crcm}$" may represent a length of a last CRC parity message located right after the last sub-message.

The total length ($p_{crc}$) of all CRC parity messages added to all of the sub-messages in the original message may be predetermined. Also, the length ($p_{crcm}$) of the last CRC parity message may be predetermined as longer than the lengths $p_{crc1}$ to $p_{crcm-1}$ of the other CRC parity messages. For example, when a number of sub-messages is three (3) and the total length ($p_{crc}$) of all CRC parity messages is 24 bits, the lengths $p_{crc1}$, $p_{crc2}$ and $p_{crc3}$ of the first to third CRC messages may be predetermined as 6 bits, 6 bits and 12 bits, respectively.

The length of the first parity added message $u_1$ may be represented by sum of the length (k) of the original message and the total length ($p_{crc}$) of all CRC parity messages as defined in the following equation 3.

$$\text{length of } U1=k+p_{crc} \quad \text{[Equation 3]}$$

As exemplified in FIG. 8B, when the number of sub-messages is "m", the CRC encoder 171 may generate the first parity added message $u_1$ by dividing the original message into "m" sub-messages and by adding the CRC parity messages having the predetermined lengths to the respective "m" sub-messages. Referring to FIG. 8B, the first parity added message $u_1$ may be the same as the original message except for the CRC parity messages added to the first parity added message $u_1$. That is, the first parity added message $u_1$ may be formed by adding the CRC parity messages to the original message, and thus the original message itself may be matched to the original message part in the first parity added message $u_1$. The CRC code may be a systematic code.

Referring back to FIG. 8A, the polar encoder 175 may generate the encoded message by performing the polar encoding to the first parity added message $u_1$. As exemplified in FIG. 8B, the polar encoder 175 may generate a second parity added message $u_2$ by adding a polar parity message to the first parity added message $u_1$ at a location where a predetermined capacity is small, and may generate the encoded message by multiplying a generation matrix with the second parity added message $u_2$. The polar parity message may be a predetermined dummy bit (e.g., a bit of "0") also referred to as a frozen bit. The predetermined capacity may be a channel capacity of respective symbols of the second parity added message $u_2$. In general, when generating the encoded message by multiplying a generation matrix with the second parity added message $u_2$, symbols located in the front part of the second parity added message $u_2$ may have lesser channel capacity while symbols located in the rear part of the second parity added message $u_2$ may have greater channel capacity. Accordingly, the polar parity message may be mainly located in the front part of the second parity added message $u_2$.

Referring to FIG. 8B, the first parity added message $u_1$ and the second parity added message $u_2$ may be the same except for the polar parity message added in the second parity added message $u_2$. That is, the second parity added message $u_2$ may be formed by adding the polar parity message to the first parity added message $u_1$, and thus the first parity added message $u_1$ itself may be matched to the first parity added message part in the second parity added message $u_2$.

The length of the second parity added message $u_2$ may be expressed by the following equation 4.

$$n=k+p_{crc}+p_{POLAR} \quad \text{[Equation 4]}$$

In equation 4, "n" may represent the length of the second parity added message $u_2$.

The encoded message may be represented by multiplication of the second parity added message $u_2$ and an n-by-n sized generation matrix G, as expressed in the following equation 5.

$$\text{encoded message}=u_2 \times G \quad \text{[Equation 5]}$$

The generation matrix G may be represented by the following equation 6.

$$G = \begin{bmatrix} 1 & 0 \\ 1 & 1 \end{bmatrix} \otimes N \quad \text{[Equation 6]}$$

In equation 6, "$\otimes$" may represent the Kronecker product and "N" may represent an arbitrary integer making the size of the generation matrix G as n-by-n. The generation matrix G may be expressed by "N" times of the Kronecker products of the matrix $$"\begin{bmatrix} 1 & 0 \\ 1 & 1 \end{bmatrix}".$$

Referring to equations 5 and 6, the encoded message may have the same length as the second parity added message $u_2$. As described above, the second parity added message $u_2$ may have a length of "n".

Hereinafter, described with reference to FIGS. 8A and 8B will be a decoding operation of recovering the encoded message to the original message.

Referring to FIG. 8A, the polar decoder 181 may generate second candidate messages $u_4$ by performing the polar decoding operation to the encoded message read from the semiconductor memory device 210. As illustrated in FIG. 8B, the polar decoder 181 may generate the second candidate messages $u_4$ by generating first candidate messages $u_3$, a number of which is smaller than a predetermined number $L_{max}$ of lists, according to the successive cancellation list decoding scheme, and by eliminating polar parity messages from the generated first candidate messages $u_3$. According to the successive cancellation list decoding scheme, a log likelihood ratio of an (i)th symbol of the second parity added message $u_2$ is calculated on the basis of the channel capacity ("i" is an integer between one (1) and "n", and "n" is a length of the encoded message). The first candidate messages $u_3$ is generated on the basis of the calculated log likelihood ratio and a location of the frozen bit (i.e., the predetermined dummy bit, e.g., a bit of "0", of the polar parity message).

For example, when the predetermined number $L_{max}$ of lists for the encoded message is two (2), according to the successive cancellation list decoding scheme, respective symbols of the first candidate messages $u_3$ may sequentially assumed to have a value of "0" or "1". Therefore, 2 first candidate messages $u_3$ may be generated to respectively have "0" and "1" as values of first symbols included therein. Then, 4 first candidate messages $u_3$ may be generated to respectively have "00", "01", "10" and "11" as values of first and second symbols included therein. In this case that the predetermined number $L_{max}$ of lists for the encoded message is 2, 2 among 4 first candidate messages $u_3$ having "00", "01", "10" and "11" as values of first and second symbols may be selected on the basis of the log likelihood ratio. For example, when 2 first candidate messages $u_3$ having "01" and "10" as values of first and second symbols are selected among the 4 first candidate messages $u_3$ having "00", "01", "10" and "11" as values of first and second symbols, 4 first candidate messages $u_3$ may be generated to respectively have "010", "011", "100" and "101" as values of first to third symbols and then 2 among 4 first candidate messages $u_3$ having "010", "011", "100" and "101" as values of first to third symbols may be selected on the basis of the log likelihood ratio. In this manner, 2 first candidate messages $u_3$ may be generated by applying the successive cancellation list decoding scheme to the encoded message.

When an (i)th symbol of the first candidate messages $u_3$, which is generated by applying the successive cancellation list decoding scheme to (i)th symbol of the encoded message, is the polar parity message, the polar decoder 181 may assign a predetermined dummy value (e.g., a value of "0") to the (i)th symbol of the first candidate messages $u_3$. That is, when (i)th symbol of the first candidate messages $u_3$ is the polar parity message of the second parity added message $u_2$, the polar decoder 181 may assign the predetermined dummy value to the (i)th symbol of the first candidate messages $u_3$.

The polar decoder 181 may generate the second candidate messages $u_4$ by eliminating the polar parity message from the first candidate messages $u_3$, which are assumed by applying the successive cancellation list decoding scheme to respectively predetermined parts in the encoded message, and may provide the generated second candidate messages $u_4$ to the CRC decoder 185. The respectively predetermined parts in the encoded message may be determined on the basis of a symbol corresponding to a last symbol of the CRC parity message in the second parity added message $u_2$. Specifically, a first symbol of the respectively predetermined parts in the encoded message may correspond to a symbol following a previous CRC parity message in the second parity added message $u_2$, and a last symbol of the respectively predetermined parts in the encoded message may correspond to a last symbol of a current CRC parity message in the second parity added message $u_2$. A first one among the respectively predetermined parts in the encoded message, which does not have corresponding previous CRC parity message, may be set to have a first symbol corresponding to a first symbol of the second parity added message $u_2$. For example, the first one among the respectively predetermined parts in the encoded message may have first to last symbols respectively corresponding to the first symbol of the second parity added message $u_2$ to a last symbol of a first CRC parity message in the second parity added message $u_2$.

The polar decoder 181 may apply the successive cancellation list decoding scheme to a current part of the encoded message based on the second candidate messages $u_4$ for previous parts of the encoded message, which pass the CRC parity check performed by the CRC decoder 185, and the first candidate messages $u_3$ corresponding to the second candidate messages $u_4$ of the previous parts. For example, the polar decoder 181 may apply the successive cancellation list decoding scheme to a second part of the encoded message based on the second candidate messages $u_4$ for the first part of the encoded message, which pass the CRC parity check among the second candidate messages $u_4$ for the first part of the encoded message, and the first parity added message $u_1$ for the first part of the encoded message, wherein the first parity added message $u_1$ corresponds to the second candidate messages $u_4$ for the first part of the encoded message, which pass the CRC parity check among the second candidate messages $u_4$ for the first part of the encoded message. In a similar manner, the polar decoder 181 may apply the successive cancellation list decoding scheme to a third part of the encoded message based on the second candidate messages $u_4$ for the first and second parts of the encoded message, which pass the CRC parity check among the second candidate messages $u_4$ for the first and second parts of the encoded message, and the first parity added message $u_1$ for the first and second parts of the encoded message, wherein the first parity added message $u_1$ corresponds to the second candidate messages $u_4$ for the first and second parts of the encoded message, which pass the CRC parity check among the second candidate messages $u_4$ for the first and second parts of the encoded message.

The CRC decoder 185 may determine whether the second candidate messages $u_4$, which are for the respectively predetermined parts and provided from the polar decoder 181, and a number of which is smaller than the predetermined number $L_{max}$ of lists, pass the CRC parity check or not. The CRC decoder 185 may eliminate the second candidate messages $u_4$, which are for the respectively predetermined parts and determined to fail the CRC parity check, and the first candidate messages $u_3$ corresponding to the CRC-failed second candidate messages $u_4$. The CRC decoder 185 may provide the polar decoder 181 with information INFO on the second candidate messages $u_4$, which are for the respectively predetermined parts and determined to pass the CRC parity check, and the first candidate messages $u_3$ corresponding to the CRC-passed second candidate messages $u_4$.

Upon receiving the second candidate messages $u_4$ for the last part from the polar decoder 181, the CRC decoder 185 may generate the decoded message by eliminating the CRC parity message of the second candidate messages $u_4$, which are for the respectively predetermined parts and determined to pass the CRC parity check.

When there is a plurality of the second candidate messages $u_4$, which are for the respectively predetermined parts and determined to pass the CRC parity check, the CRC decoder 185 may generate a single decoded message by selecting one having the greatest log likelihood ratio among the plurality of the second candidate messages $u_4$, which are for the respectively predetermined parts and determined to pass the CRC parity check.

As described above, when decoding the encoded message generated in accordance with an embodiment of the present invention, the required capacity of the memory may be reduced. Specifically, when decoding an encoded message, which is generated by adding a CRC parity message of a predetermined length to an end of the original message, candidate messages are required as many as a number $L_{max}$ of lists of whole encoded message, and thus the memories for the candidate messages are required. However, when applying the successive cancellation list decoding scheme to the encoded message generated in accordance with an embodiment of the present invention, paths failing to satisfy intermediate CRC parity messages, which are ones other than the last CRC parity message among CRC parity messages split into a plurality, may be eliminated and then a great deal of parts of the candidate messages (e.g., the first and second candidate messages $u_3$ and $u_4$) may be overlapped during a following successive cancellation list decoding operation. Therefore, the memories required for the decoding operation may be reduced by saving the overlapped parts of the candidate messages into the same memory area.

Figure 8C:
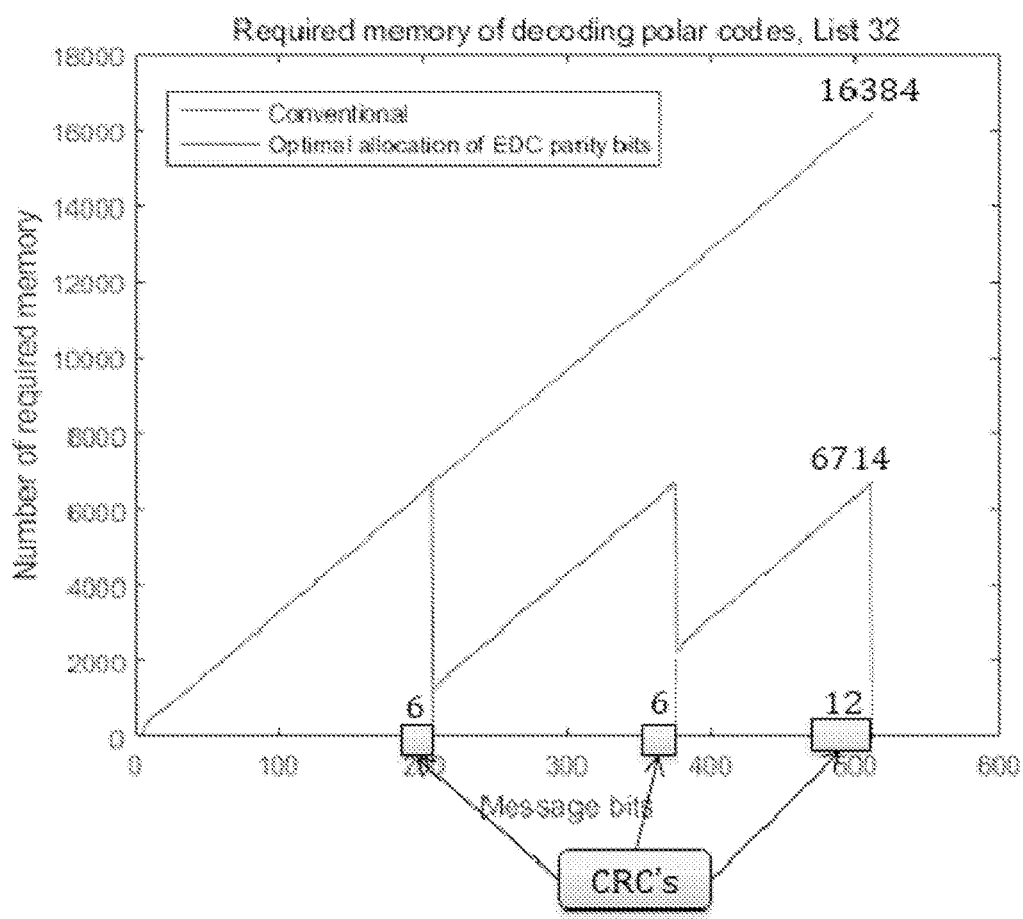
FIG. 8C is a graph illustrating a memory size for an exemplary embodiment.

FIG. 8C is a graph illustrating a memory size required for a case where a number ($L_{max}$) of lists is 32.

As illustrated in FIG. 8C, when the encoded message is of 488 bits and CRC parity messages included therein is of 24 bits, a memory of 16384 bits is required for decoding the encoded message according to a conventional method, while a memory of only 6714 bits is required for decoding the encoded message in accordance with an embodiment of the present invention. Hence, in accordance with the illustrated embodiment of FIG. 8C, the ECC encoder requires a memory space corresponding to only 40% of the memory space required according to a conventional method.

Figure 9:
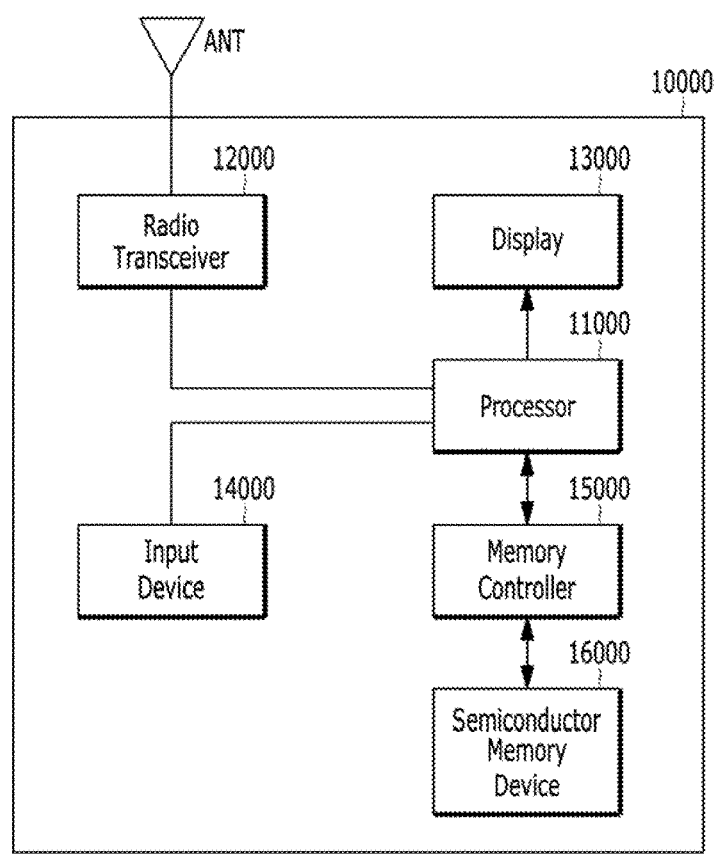
FIG. 9 is a block diagram schematically Illustrating an electronic device including a semiconductor memory system in accordance with an embodiment of the present invention.

FIG. 9 is a block diagram schematically illustrating an electronic device 10000 including a memory controller 15000 and a semiconductor memory device 16000 in accordance with an embodiment of the present invention.

Referring to FIG. 9, the electronic device 10000 may be any suitable electronic device such as a cellular phone, a smart phone, or a tablet PC including the semiconductor memory device 16000 and the memory controller 15000. The semiconductor memory device 16000 may be implemented by any suitable memory device, including, for example, a flash memory device, such as a NAND or a NOR flash. The memory controller 15000 may control the semiconductor memory device 16000.

The semiconductor memory device 16000 may correspond to the semiconductor memory device 200 described above with reference to FIGS. 3 to 4B. The semiconductor memory device 16000 may store random data.

The memory controller 15000 may correspond to the memory controller 100 described with reference to FIGS. 3 to 8E. The memory controller 15000 may be controlled by a processor 11000 which may control overall operations of the electronic device 10000.

Data stored in the semiconductor memory device 16000 may be displayed through a display 13000 under the control of the memory controller 15000. The memory controller 15000 may operate under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000. The input device 14000 may be implemented, for example, by a pointing device such as a touch pad or a computer mouse, a key pad, or a keyboard.

The processor 11000 may control the display 13000 so that the data from the semiconductor memory device 16000, the radio signal from the radio transceiver 12000 or the data from the input device 14000 is displayed through the display 13000.

Figure 10:
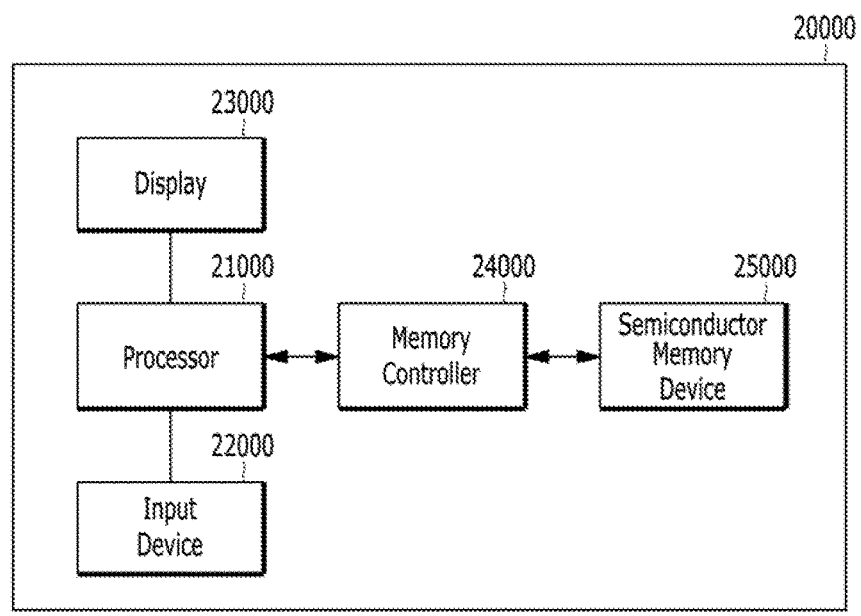
FIG. 10 is a block diagram schematically illustrating an electronic device including a semiconductor memory system in accordance with another embodiment of the present invention.

FIG. 10 is a block diagram schematically illustrating an electronic device 20000 including a memory controller 24000 and a semiconductor memory device 25000 in accordance with another embodiment of the present invention.

The memory controller 24000 and the semiconductor memory device 25000 may correspond to the memory controller 100 and the semiconductor memory device 200 described with reference to FIGS. 3 to 8E, respectively.

Referring to FIG. 10, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, e.g., a flash memory device, and the memory controller 24000 to control the operations of the semiconductor memory device 25000.

The electronic device 20000 may include a processor 21000 to control overall operations of the electronic device 20000. The memory controller 24000 may be controlled by the processor 21000.

The processor 21000 may display data stored in the semiconductor memory device 25000 through a display 23000 according to an input signal from an input device 22000. For example, the input device 22000 may be implemented, for example, by a pointing device such a touch pad or a computer mouse, a key pad, or a keyboard.

Figure 11:
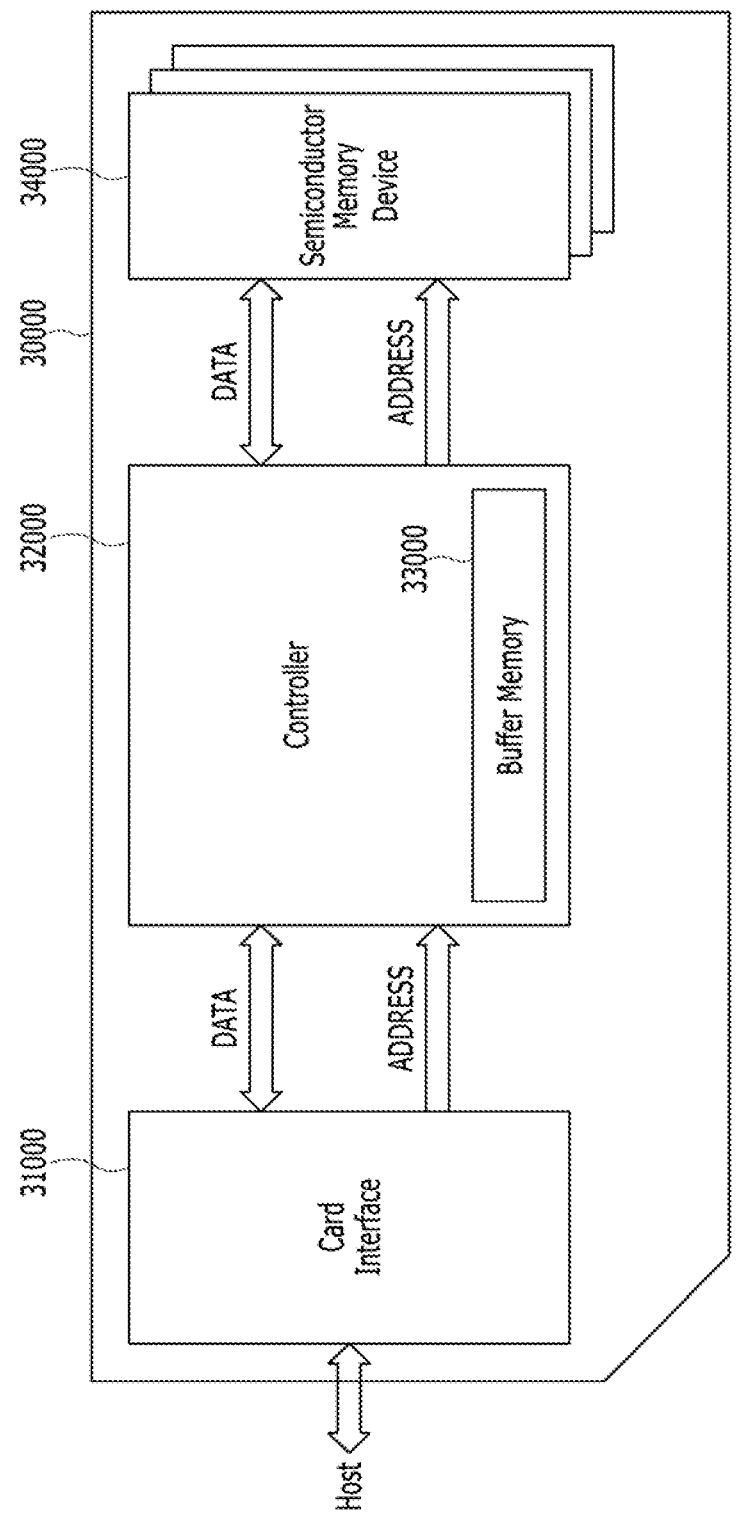
FIG. 11 is a block diagram schematically illustrating an electronic device including a semiconductor memory system in accordance with yet another embodiment of the present invention.

FIG. 11 is a block diagram schematically illustrating an electronic device 30000 including a controller 32000 and a semiconductor memory device 34000, in accordance with yet another embodiment of the present invention.

The controller 32000 and the semiconductor memory device 34000 may correspond to the memory controller 100 and the semiconductor memory device 200 described with reference to FIGS. 3 to 8E, respectively.

Referring to FIG. 11, the electronic device 30000 may include a card Interface 31000, the controller 32000, and the semiconductor memory device 34000 which may be implemented, for example, with a flash memory device.

The electronic device 30000 may exchange data with a host through the card interface 31000. The card interface 31000 may be a secure digital (SD) card interface or a multi-media card (MMC) interface, which will not limit the scope of the present invention. The card interface 31000 may interface the host and the controller 32000 according to a communication protocol of the host capable of communicating with the electronic device 30000.

The controller 32000 may control overall operations of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic device 30000 is connected with the host such as a PC, a tablet PC, a digital camera, a digital audio player, a mobile phone, console video game hardware or a digital set-top box, the host may exchange data with the semiconductor memory device 34000 through the card interface 31000 and the controller 32000.

Figure 12:
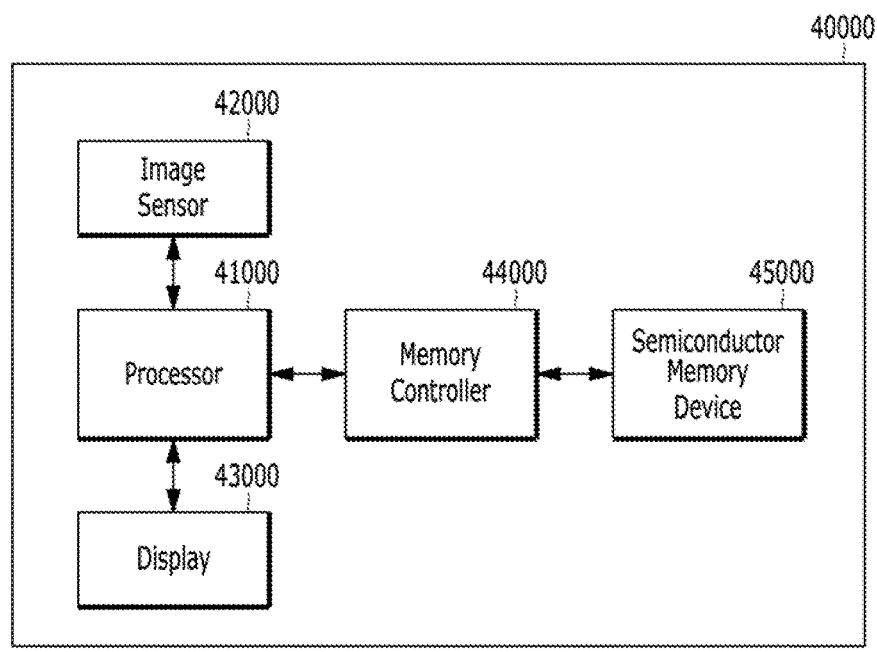
FIG. 12 is a block diagram schematically Illustrating an electronic device including a semiconductor memory system in accordance with yet another embodiment of the present invention.

FIG. 12 is a block diagram schematically illustrating an electronic device 40000 including a memory controller 44000 and a semiconductor memory device 45000 in accordance with yet another embodiment of the present invention.

The memory controller 44000 and the semiconductor memory device 45000 may correspond to the memory controller 100 and the semiconductor memory device 200 described with reference to FIGS. 3 to 8E, respectively.

Referring to FIG. 12, the electronic device 40000 may include the semiconductor memory device 45000, e.g., a flash memory device, the memory controller 44000 to control a data processing operation of the semiconductor memory device 45000, and a processor 41000 to control overall operations of the electronic device 40000.

Further, an image sensor 42000 of the electronic device 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 13:
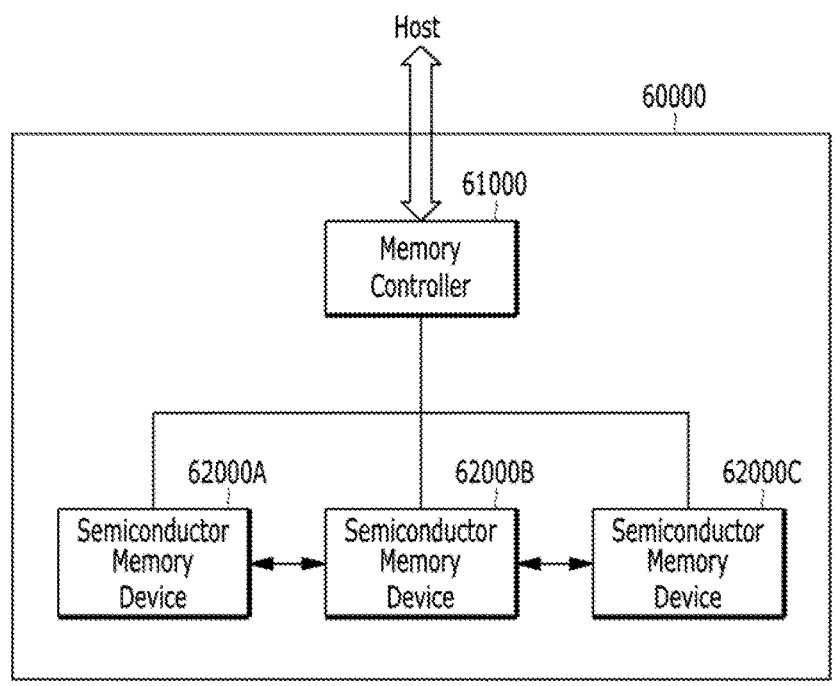
FIG. 13 is a block diagram schematically illustrating an electronic device including a semiconductor memory system in accordance with yet another embodiment of the present invention.

FIG. 13 is a block diagram schematically illustrating an electronic device 60000 including a memory controller 61000 and semiconductor memory devices 62000A, 62000B, and 62000C, in accordance with yet another embodiment of the present invention.

The memory controller 61000 and each of the semiconductor memory devices 62000A, 62000B, and 62000C may correspond to the memory controller 100 and the semiconductor memory device 200 described with reference to FIGS. 3 to 8E, respectively.

Referring to FIG. 13, the electronic device 60000 may be implemented by a data storage device such as a solid state drive (SSD).

The electronic device 60000 may include the plurality of semiconductor memory devices 62000A, 62000B, and 62000C and the memory controller 61000 to control a data processing operation of each of the semiconductor memory devices 62000A, 62000B, and 62000C.

The electronic device 60000 may be implemented by a memory system or a memory module.

For example, the memory controller 61000 may be implemented outside or inside the electronic device 60000.

Figure 14:
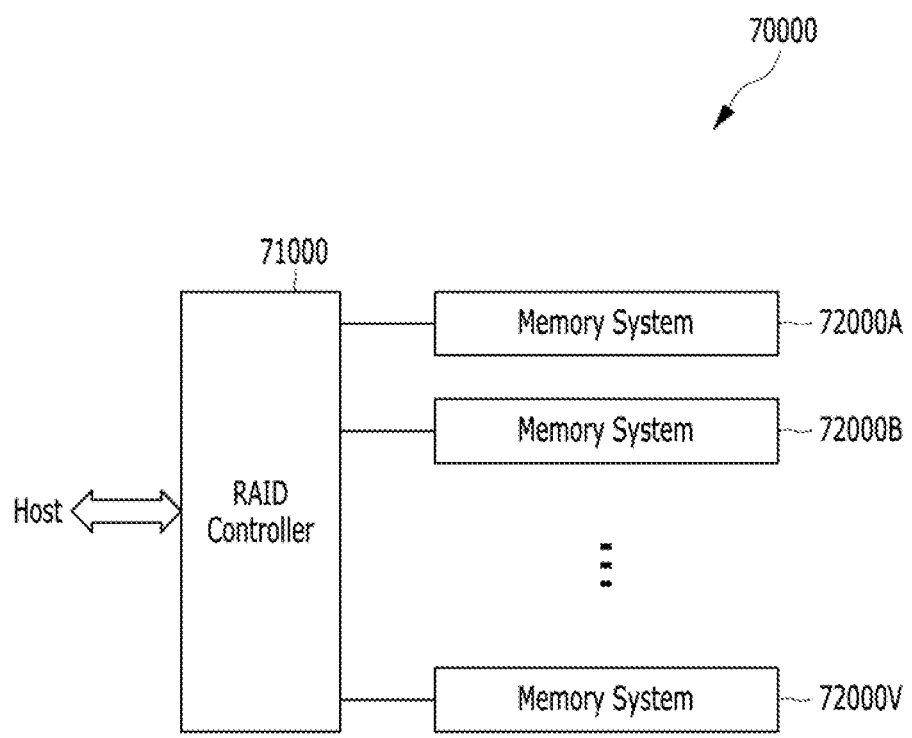
FIG. 14 is a block diagram of a data processing system including the electronic device shown in FIG. 13 according to yet another embodiment of the present invention.

FIG. 14 is a block diagram of a data processing system including the electronic device 6000 described with reference to FIG. 13.

Referring to FIGS. 13 and 14, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic device 60000 described with reference to FIG. 13. The memory systems 72000A to 72000N may form a RAID array. The data storage device 70000 may be implemented by an SSD.

During a program operation, the RAID controller 71000 may output program data, which is output from a host, to one of the memory systems 72000A to 72000N selected according to one of a plurality of RAID levels based on RAID level information output from the host.

During a read operation, the RAID controller 71000 may transfer data, which is read from one of the memory systems 72000A to 72000N, to the host according to one of the RAID levels based on the RAID level information output from the host.

While the present invention has been described with respect to specific embodiments, it will be apparent to those skilled in the art that various changes and modifications may be made without departing from the spirit and scope of the invention as defined in the following claims.

What is claimed is:

1. An operation method of a controller, the method comprising:
    dividing, by a CRC encoder, an original message into a plurality of sub-messages;
    generating, by the CRC encoder, a first parity added message by adding a cyclic redundancy check (CRC) parity message of a predetermined length to each of the sub-messages; and
    performing, by a polar encoder, a polar encoding operation to the first parity added message provided from the CRC encoder to generate an encoded message.

2. The method of claim 1, wherein a length of the CRC parity message added to a last one among the sub-messages is greater than those of remaining ones among the CRC parity messages.

3. The method of claim 1, wherein each CRC parity message secures the sub-messages and corresponding CRC messages, which are located there before in the first parity added message.

4. The method of claim 1, wherein each CRC parity message secures a corresponding one located right there before among the sub-messages.

5. An operation method of a controller, the method comprising:
    performing, by a polar decoder, a polar decoding operation to an encoded message; and
    generating, by a CRC decoder, a decoded message by performing a CRC decoding operation to the polar-decoded message provided from the polar decoder,
    wherein the encoded message includes:
    a predetermined number of sub-messages; and
    a cyclic redundancy check (CRC) parity message of a predetermined length for each of the sub-messages, and
    wherein the encoded message is further polar-encoded message.

6. The method of claim 5, wherein the generating of the decoded message includes:
    generating first candidate messages by applying a successive cancellation list decoding scheme to a plurality of respectively predetermined parts of the encoded message;
    generating second candidate messages by eliminating polar parity messages of the first candidate messages for the plurality of respectively predetermined parts; and
    generating the decoded message by eliminating the CRC parity message of the second candidate message, which passes a CRC parity check among the second candidate messages.

7. The method of claim 6, wherein the encoded message is divided into the plurality of respectively predetermined parts with reference to a symbol, which corresponds to a last symbol of the CRC parity message, of the encoded message.

8. The method of claim 6, wherein the first candidate messages are generated as many as a predetermined number of lists for the plurality of respectively predetermined parts.

9. The method of claim 6, wherein the decoded message is generated by further eliminating the second candidate message, which fails the CRC parity check among the second candidate messages, and the first candidate message corresponding to the CRC-failed second candidate message.

10. The method of claim 6, wherein, when there is a plurality of the second candidate messages, which pass the CRC parity check among the second candidate messages, the decoded message is generated by eliminating the CRC parity message from one having a greatest log likelihood ratio among the plurality of the CRC-passed second candidate messages.

11. A controller comprising:
    a polar decoder suitable for performing a polar decoding operation to an encoded message; and
    a CRC decoder suitable for generating a decoded message by performing a CRC decoding operation to the polar-decoded message,
    wherein the encoded message includes:
    a predetermined number of sub-messages; and
    a cyclic redundancy check (CRC) parity message of a predetermined length for each of the sub-messages, and
    wherein the encoded message is further polar-encoded message.

12. The controller of claim 11, wherein the polar decoder generates first candidate messages by applying a successive cancellation list decoding scheme to a plurality of respectively predetermined parts in the encoded message, and generates second candidate messages by eliminating polar parity messages of the first candidate messages for the plurality of respectively predetermined parts.

13. The controller of claim 12, wherein the CRC decoder generates the decoded message by eliminating the CRC parity message of the second candidate message, which passes a CRC parity check among the second candidate messages.

14. The controller of claim 13, wherein the encoded message is divided into the plurality of respectively predetermined parts with reference to a symbol, which corresponds to a last symbol of the CRC parity message, of the encoded message.

15. The controller of claim 13, wherein the polar decoder generates the first candidate messages as many as a predetermined number of lists for the plurality of respectively predetermined parts.

16. The controller of claim 13, wherein the CRC decoder further eliminates the second candidate message, which fails the CRC parity check among the second candidate messages, and the first candidate message corresponding to the CRC-failed second candidate message.

17. The controller of claim 13, wherein when there is a plurality of the second candidate messages, which pass the CRC parity check among the second candidate messages, the CRC decoder generates the decoded message by eliminating the CRC parity message from one having a greatest log likelihood ratio among the plurality of the CRC-passed second candidate messages.

18. The controller of claim 11, wherein a length of the CRC parity message added to a last one among the sub-messages is greater than those of remaining ones among the CRC parity messages and wherein each CRC parity message secures at least a corresponding one located right there before among the sub-messages.

19. The controller of claim 11, further comprising:
a cyclic redundancy check (CRC) encoder suitable for generating the sub-messages by dividing an original message, and generating a first parity added message by adding the CRC parity message to each of the sub-messages;
a polar encoder suitable for generating the encoded message by performing a polar encoding operation to the first parity added message.

20. The controller of claim 11, wherein a length of the CRC parity message added to a last one among the sub-messages is greater than those of remaining ones among the CRC parity messages.

* * * * *